(12) United States Patent
Hsu et al.

(10) Patent No.: US 10,878,881 B1
(45) Date of Patent: Dec. 29, 2020

(54) MEMORY APPARATUS AND REFRESH METHOD THEREOF

(71) Applicant: NANYA TECHNOLOGY CORPORATION, New Taipei (TW)

(72) Inventors: Ting-Shuo Hsu, New Taipei (TW); Chih-Wei Shen, Yunlin County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/697,063

(22) Filed: Nov. 26, 2019

(51) Int. Cl.
*G11C 7/00* (2006.01)
*G11C 11/406* (2006.01)
*G11C 11/409* (2006.01)

(52) U.S. Cl.
CPC ...... *G11C 11/40626* (2013.01); *G11C 11/409* (2013.01); *G11C 11/40615* (2013.01); *G11C 11/40618* (2013.01)

(58) Field of Classification Search
CPC ........ G11C 11/40626; G11C 11/40618; G11C 5/025
See application file for complete search history.

(56) References Cited

U.S. PATENT DOCUMENTS

| | | | | |
|---|---|---|---|---|
| 9,432,298 | B1* | 8/2016 | Smith | H04L 49/9057 |
| 2012/0099389 | A1* | 4/2012 | Park | G11C 11/40622 |
| | | | | 365/200 |
| 2012/0163413 | A1* | 6/2012 | Kim | G01K 13/10 |
| | | | | 374/152 |
| 2013/0308405 | A1* | 11/2013 | Jeong | G11C 11/40618 |
| | | | | 365/222 |
| 2014/0146624 | A1* | 5/2014 | Son | G11C 29/808 |
| | | | | 365/200 |
| 2016/0148905 | A1* | 5/2016 | Yu | H01L 25/0657 |
| | | | | 257/48 |
| 2017/0083259 | A1* | 3/2017 | Lee | G11C 11/40626 |
| 2019/0012263 | A1* | 1/2019 | Jenne | G05D 23/1917 |
| 2020/0105722 | A1* | 4/2020 | Sethuraman | G06F 12/10 |

* cited by examiner

*Primary Examiner* — Tuan T Nguyen
(74) *Attorney, Agent, or Firm* — JCIPRNET

(57) ABSTRACT

The memory apparatus includes a plurality of memory chips and a plurality of temperature sensors. The memory chips are coupled to each other. The temperature sensors are respectively disposed on the memory chips. One of the memory chips is configured to be a master memory chip, and a first temperature sensor of the master memory chip is enabled to sense an ambient temperature. The master memory chip generates a refresh rate control signal according to the ambient temperature and controls refresh rates of all of the memory chips.

14 Claims, 3 Drawing Sheets

MEMORY APPARATUS AND REFRESH METHOD THEREOF

BACKGROUND OF THE INVENTION

Field of Invention

The present invention generally relates to a memory apparatus and a refresh method thereof, and more particularly to the refresh method with variable refresh rate according to an ambient temperature.

Description of Prior Art

In conventional art, a dynamic random access memory (DRAM) chip has a temperature sensor for sensing an ambient temperature. Then the DRAM chip can determine a refresh rate according to the ambient temperature. For a memory apparatus having a plurality of DRAM chips, there are many temperature sensors respectively disposed in the DRAM chips. That is, a plurality of different refresh rates may be determined, and function error of the memory apparatus can be happened.

SUMMARY OF THE INVENTION

The present invention provides a memory apparatus and a refresh method thereof. The memory apparatus has a plurality of memory chips which are refreshed according to a same refresh rate.

The memory apparatus includes a plurality of memory chips and a plurality of temperature sensors. The memory chips are coupled to each other. The temperature sensors are respectively disposed on the memory chips. One of the memory chips is configured to be a master memory chip, and a first temperature sensor of the master memory chip is enabled to sense an ambient temperature. The master memory chip generates a refresh rate control signal according to the ambient temperature and controls refresh rates of all of the memory chips.

The refresh method for the memory apparatus includes configuring one of the memory chips to be a master memory chip; enabling a first temperature sensor of the master memory chip to sense an ambient temperature; generating a refresh rate control signal according to the ambient temperature by the master memory chip; and, controlling refresh rates of all of the memory chips according to the refresh rate control signal.

Accordingly, the memory apparatus of present disclosure sets one of a plurality of memory chips to be a master memory chip. The master memory chip obtains an ambient temperature by the temperature sensor thereof, and generate a refresh rate control signal according to the ambient temperature. Further, the refresh rate control signal is transported to all of the memory chips to control refresh rates of all of the memory chips. Such as that, the refresh rates of all of the memory chips are controllable and function error of the memory apparatus can be avoid.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
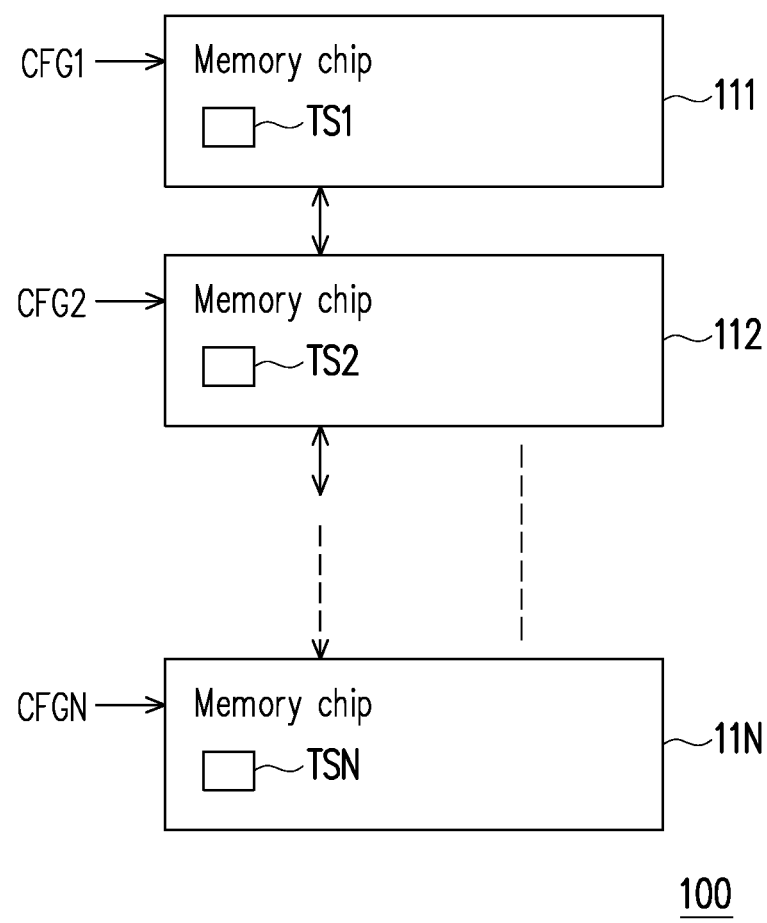
FIG. 1 is schematic diagram of a memory apparatus according to an embodiment of present disclosure.

Reference will now be made in detail to the present preferred embodiment of the invention, examples of which are illustrated in the accompanying drawings. Wherever possible, the same reference numbers are used in the drawings and the description to refer to the same or like parts.

Please refer to FIG. 1, which illustrates a schematic diagram of a memory apparatus according to an embodiment of present disclosure. The memory apparatus 100 includes a plurality of memory chips 111-11N and a plurality of temperature sensors TS1-TSN. In present disclosure, the memory chips 111-11N are coupled to each other, and the temperature sensors TS1-TSN are respectively disposed in the memory chips 111-11N. The memory chips 111-11N further respectively receive a plurality of configuration signals CFG1-CFGN. One of the memory chips 111-11N is configured to be a master memory chip according to the configuration signals CFG1-CFGN, and the other memory chips 111-11N are configured to be non-master memory chips according to the configuration signals CFG1-CFGN.

In present embodiment, merely one of the memory chips 111-11N can be set to the master memory chip. Take the memory chip 11N being set to the master memory chip as an example. The temperature sensor TSN of the memory chip 11N may be enabled according to the configuration signal CFGN, and the temperature sensors TS1-TSN−1 may be disabled according to the configuration signals CFG1-CFGN−1. The temperature sensor TSN is enabled to sense an ambient temperature, and the memory chip 11N can generate a refresh rate control signal according to the ambient temperature.

On the other hand, the memory chip 11N transports the refresh rate control signal to all of the memory chips 111-11N−1. The memory chips 111-11N can respectively set refresh rates according to the same refresh rate control signal. In this embodiment, the refresh rates of all the memory chips 111-11N can be the same.

Since the refresh rates of all the memory chips 111-11N are set to be equaled. Data accessing operation performed on the memory chips 111-11N can be well controlled, and function error for the memory apparatus 100 can be avoid.

It should be noted here, each of the configuration signals CFG1-CFGN can be provided by a pin option code, a fuse code or an external command from an external electronic device. In detail, in the pin option code manner, each of the memory chips 111-11N has at least one pin for receiving the configuration signal CFG1-CFGN. Take the configuration signal CFG1 as an example. The memory chip 111 may has at least one pin to receive the configuration signal CFG1. The configuration signal CFG1 may be a one-bit signal, and if the configuration signal CFG1 is at a first logic level, the memory chip 111 is set to the master memory chip. On the contrary, if the configuration signal CFG1 is at a second logic level which is different form the first logic level, the memory chip 111 is set to the non-master memory chip. In the fuse code manner, each of the memory chips 111-11N may has an electric fuse circuit for generating each of the configuration signals CFG1-CFGN. The fuse code can be generated by a trimming scheme or a laser cut scheme, and there is no specific limitation here. Further, in the external command manner, the external electronic device can send the external command to be the configuration signals CFG1-CFGN to the memory chips 111-11N. The memory chips 111-11N can decode the received external command, and whether each of the memory chips 111-11N is the master memory chip or not can be determined.

In present disclosure, the memory chips 111-11N are dynamic random access memory (DRAM) chips. The temperature sensors TS1-TSN may be thermal resistors.

Figure 2:
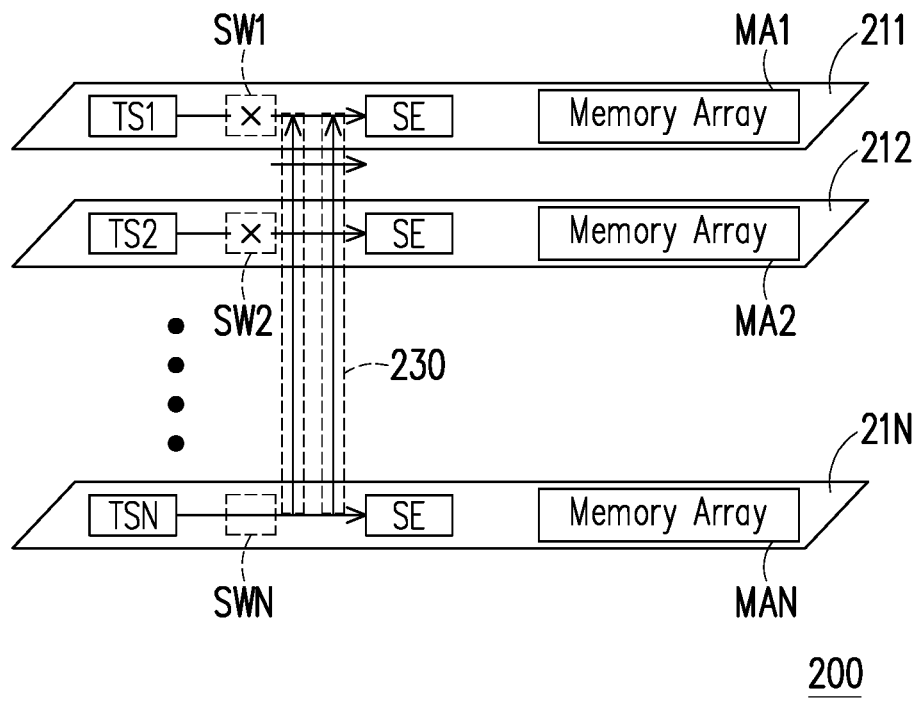
FIG. 2 is a schematic diagram of a memory apparatus according to another embodiment of present disclosure.

Please refer to FIG. 2, which illustrates a schematic diagram of a memory apparatus according to another embodiment of present disclosure. The memory apparatus 200 includes a plurality of memory chips 221-22N, a plurality of temperature sensors TS1-TSN, a plurality of switches SW1-SWN, and a plurality of through-silicon vias (TSVs) 230. The memory chips 221-22N are arranged in a stack, and the memory chips 221-22N are coupled to each other through the TSVs 230. The temperature sensors TS1-TSN are respectively disposed in the memory chips 211-21N, and the switches SW1-SWN are respectively disposed in the memory chips 211-21N, too. Each of the switches SW1-SWN is coupled to the corresponding temperature sensors TS1-TSN, and each of the switches SW1-SWN is turned on or cut-off according to whether the corresponding memory chip 211-21N is the master memory chip or not.

In detail, if the memory chip 21N is configurated to be the master memory chip, the switch SWN is turned on, and the temperature sensor TSN is enable to sense the ambient temperature. The memory chip 21N can generate a refresh rate control signal SE according to the ambient temperature. On the other hand, the memory chips 211-21N−1 are configurated to be the non-master memory chips, the switches SW1-SWN−1 are cut-off, and the temperature TS1-TSN−1 are disabled. Moreover, the refresh rate control signal SE can be transported through the switch SWN and the TSVs 230 to the memory chips 211-21N−1. That is, the memory chips 211-21N can obtain the same refresh rate control signal SE, and set refresh rates with the same value according to the refresh rate control signal SE.

In this embodiment, the memory chips 211-21N respectively have a plurality of memory arrays MA1-MAN. The refresh operations with the same refresh rate are performed on the memory arrays MA1-MAN, and the memory arrays MA1-MAN may be DRAM arrays.

Figure 3:
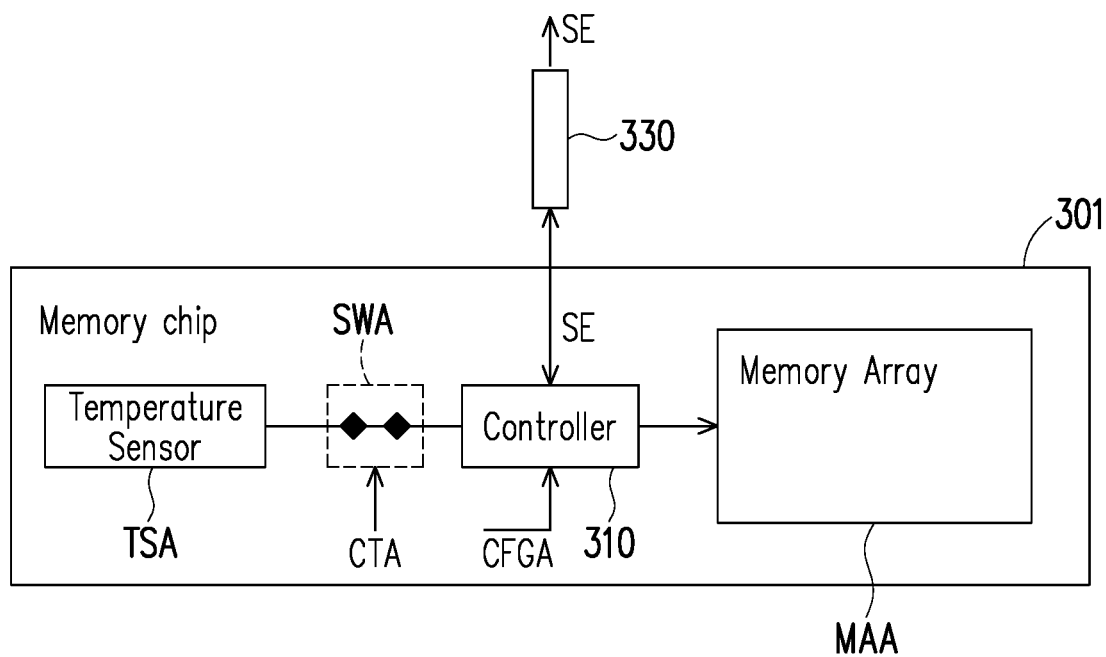
FIG. 3 is a schematic diagram of a memory chip according to an embodiment according to present disclosure.

Please refer to FIG. 3, which illustrates a schematic diagram of a memory chip according to an embodiment according to present disclosure. The memory chip 301 includes a temperature sensor TSA, a switch SWA, a controller 310 and a memory array MAA. The switch SWA is coupled between the temperature sensor TSA and the controller 310. The controller 310 receives a configuration signal CFGA, and generates a control signal CTA according to the configuration signal CFGA. In detail, if the configuration signal CFGA is used to set the memory chip 301 to be a master memory chip, the controller 310 can generates the control signal CTA to turn on the switch SWA according to the configuration signal CFGA. On the contrary, if the configuration signal CFGA is used to set the memory chip 301 to be a non-master memory chip, the controller 310 can generates the control signal CTA to cut-off the switch SWA according to the configuration signal CFGA.

If the switch SWA is turned on, the temperature sensor TSA is enabled to sense an ambient temperature correspondingly, and if the switch SWA is cut-off, the temperature sensor TSA is disabled. Furthermore, the controller 310 is further coupled to the memory array MAA and one or more VIAs 330. If the memory chip 301 is the master memory chip. The controller 310 further generates a refresh rate control signal SE according to the ambient temperature, and performs refresh operation on the memory array MAA by a refresh rate controlled by the refresh rate control signal SE. the refresh rate control signal SE is also transported to the other memory chip(s) which is (are) not the master memory chip(s).

If the memory chip 301 is the non-master memory chip, the controller 310 receives the refresh rate control signal SE through the VIAs 330. The controller 310 can perform refresh operation on the memory array MAA by a refresh rate controlled by the refresh rate control signal SE.

By the disclosures mentioned above, all of the memory chips in the same memory apparatus can perform refresh operations with same refresh rate. Function error for the memory apparatus can be avoid.

Figure 4:
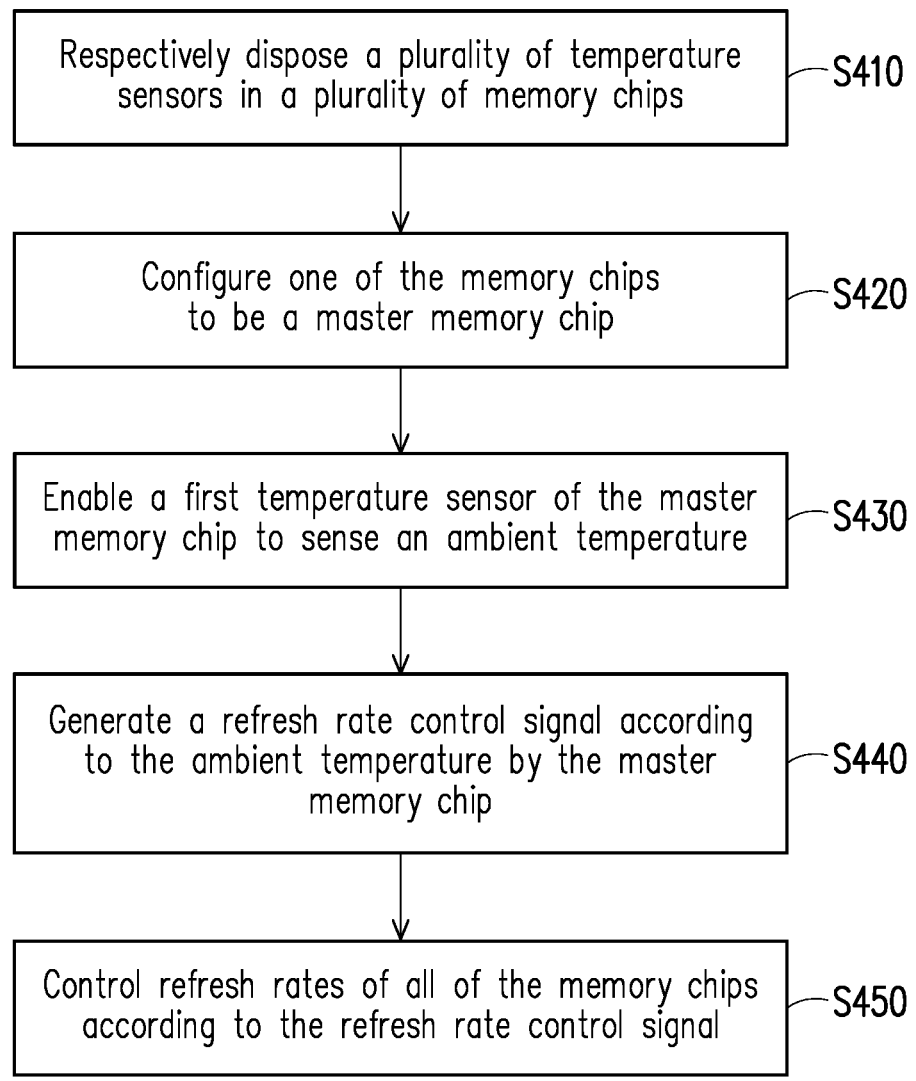
FIG. 4 is a flow chart of a refresh method for a memory apparatus of an embodiment according to present disclosure.

Please refer to FIG. 4, which illustrates a flow chart of a refresh method for a memory apparatus of an embodiment according to present disclosure. In a step S410, a plurality of temperature sensors are respectively disposed in a plurality of memory chips. Then, one of the memory chips is configured to be a master memory chip in a step S420. A step S430 is executed for enabling a first temperature sensor of the master memory chip to sense an ambient temperature, and a step S440 is executed for generating a refresh rate control signal according to the ambient temperature by the master memory chip. Moreover, a step S450 is executed for controlling refresh rates of all of the memory chips according to the refresh rate control signal.

Detail operations of the steps S410-S450 have been described in the embodiments mentioned above, and no more repeated description here.

In summary, one of a plurality of memory chips of the memory apparatus of present disclosure is configured to be the master memory chip. By enabling the temperature sensor of the mast memory chip and disabling the temperature sensors of the non-mast memory chips, the master memory chip can generate a unique one refresh rate control signal, and refresh rates of refresh operation for all of the memory chips can be controlled. Such as that, function error for the memory apparatus can be avoid.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A memory apparatus, comprising:
 a plurality of memory chips, wherein the memory chips are coupled to each other; and
 a plurality of temperature sensors, respectively disposed on the memory chips,
 wherein one of the memory chips is configured to be a master memory chip, a first temperature sensor of the master memory chip is enabled to sense an ambient temperature, the master memory chip generates a refresh rate control signal according to the ambient temperature and controls refresh rates of all of the memory chips.

2. The memory apparatus according to claim 1, wherein at least one second temperature sensor of at least one of the memory chips which is not the master memory chip is disabled.

3. The memory apparatus according to claim 1, wherein each of the memory chips has an interface for receiving a configuration signal, wherein the configuration signal is used to configure each of the memory chips to be the master memory chip or not.

4. The memory apparatus according to claim 3, wherein the configuration signal is a pin option code or a fuse code, or the configuration signal is generated by an external command.

5. The memory apparatus according to claim 1, wherein each of the temperature sensors is a thermal resistor.

6. The memory apparatus according to claim 1, further comprising:
   a plurality of controllers, respectively disposed in the memory chips; and
   a plurality of switches, respectively coupled between the temperature sensors and the controllers,
   wherein each of the switches is turned on or cut off according whether the corresponding memory chip is the master memory chip or not.

7. The memory apparatus according to claim 1, further comprising:
   a plurality of through-silicon vias (TSVs),
   wherein the memory chips are arranged in to a stack, and the memory chips are coupled to each other through the TSVs.

8. The memory apparatus according to claim 1, further comprising:
   a plurality of memory arrays, respectively disposed in the memory chips,
   wherein the memory chips respectively perform refresh operations on the memory arrays by a same refresh rate according to the refresh rate control signal.

9. The memory apparatus according to claim 8, wherein the memory arrays are dynamic random access memory (DRAM) arrays.

10. A refresh method for a memory apparatus, comprising:
    respectively disposing a plurality of temperature sensors in a plurality of memory chips;
    configuring one of the memory chips to be a master memory chip;
    enabling a first temperature sensor of the master memory chip to sense an ambient temperature;
    generating a refresh rate control signal according to the ambient temperature by the master memory chip; and
    controlling refresh rates of all of the memory chips according to the refresh rate control signal.

11. The refresh method according to claim 10, further comprising:
    disabling at least one second temperature sensor of at least one of the memory chips which is not the master memory chip.

12. The refresh method according to claim 10, further comprising:
    respectively providing a plurality of configuration signals to the memory chips to configure each of the memory chips to be the master memory chip or not.

13. The refresh method according to claim 12, further comprising:
    providing each of the configuration signals by a pin option code, a fuse code or an external command.

14. The refresh method according to claim 10, wherein all of the memory chips are refreshed by a same refresh rate according to the refresh rate control signal.

* * * * *